United States Patent [19]

Asghar et al.

[11] Patent Number: 5,003,309

[45] **Date of Patent: * Mar. 26, 1991**

[54] APPARATUS HAVING SHARED ARCHITECTURE FOR ANALOG-TO-DIGITAL AND FOR DIGITAL-TO-ANALOG SIGNAL CONVERSION

[75] Inventors: Safdar M. Asghar; Miki Z. Moyal, both of Austin, Tex.

[73] Assignee: Advanced Micro Devices, Inc., Sunnyvale, Calif.

[*] Notice: The portion of the term of this patent subsequent to Feb. 19, 2008 has been disclaimed.

[21] Appl. No.: 428,629

[22] Filed: Oct. 30, 1989

[51] Int. Cl.[5] .............................................. H03M 1/00

[52] U.S. Cl. .................................... 341/108; 341/110

[58] Field of Search ............... 341/108, 110, 126, 143, 341/144, 155

[56] References Cited

U.S. PATENT DOCUMENTS

| | | | |
|---|---|---|---|
| 4,160,243 | 7/1979 | Moriya et al. | 341/108 |
| 4,348,768 | 9/1982 | Syala | 341/108 |
| 4,622,536 | 11/1986 | Shih et al. | 341/108 |

*Primary Examiner*—William M. Shoop, Jr.
*Assistant Examiner*—H. L. Williams
*Attorney, Agent, or Firm*—Foley & Lardner

[57] ABSTRACT

An apparatus adaptable for use in effecting communications between an analog device and a digital device, having an analog-digital-analog circuit for converting incoming analog signals received from the analog device to incoming digital signals, and for converting interpolated outgoing digital signals to outgoing analog signals. The analog-digital-analog device includes a single digital-to-analog converter and switches for selectively configuring the analog-digital-analog circuit to effect conversion of incoming analog signals to incoming digital signals or, alternatively, to effect conversion of outgoing digital signals to outgoing analog signals.

5 Claims, 2 Drawing Sheets

APPARATUS HAVING SHARED ARCHITECTURE FOR ANALOG-TO-DIGITAL AND FOR DIGITAL-TO-ANALOG SIGNAL CONVERSION

CROSS REFERENCE TO RELATED APPLICATIONS

The following applications contain subject matter similar to the subject matter of this application:

- U.S. application Ser. No. 428,614, filed Oct. 30, 1989; entitled "Apparatus Adaptable for Use in Effecting Communications Between an Analog Device and a Digital Device";
- U.S. application Ser. No. 434, 271, filed Oct. 30, 1989; entitled "Apparatus Having Shared Modular Architecture for Decimation and Interpolation";
- U.S. application Ser. No. 428,628, filed Oct. 30, 1989; entitled "Apparatus Having a Modular Decimation Architecture"; and
- U.S. application Ser. No. 429,207, filed Oct. 30, 1989; entitled "Apparatus Having Modular Interpolation Architecture".

BACKGROUND OF THE INVENTION

The present invention is directed to a communications interface apparatus adaptable for use in effecting communications between an analog device and a digital device. Specifically, in its preferred embodiment, the present invention effects communications between a voice-band device, such as a telephone, and a data processing device.

The present invention receives analog signals from a voice-band device, and converts those analog voice-bank signals to produce decimated incoming digital signals representative of the received analog voice band signals.

The present invention also receives outgoing digital signals from the data processing device, and converts those outgoing digital signals to produce an outgoing analog signal representative of the outgoing digital signal.

In the manufacturing of interface devices such as the present invention, it is common that separate duplicate components be utilized for the analog-to-digital conversion circuitry and the digital-to-analog conversion circuitry.

Such use of duplicate components results in several disadvantages. For example, in integrated circuit embodiments, the cost increase occasioned by such component duplication is not significant. However, such duplicate components require additional trimming during manufacture in order that gains, accuracy, and offsets and biases are balanced within the analog-to-digital functional path and within the digital-to-analog functional path.

Another disadvantage is that the use of duplicate components necessarily requires that a greater chip area be occupied. Thus, the smallness of a chip implementation of such a device is inherently limited by the necessity to duplicate components to effect the two functions required.

The present invention is designed to overcome some of the shortcomings of duplicate-component interface apparatus for use in effecting communications between analog and digital devices.

SUMMARY OF THE INVENTION

The invention is an apparatus adaptable for use in effecting communications between an analog device and a digital device, having an analog-digital-analog circuit for converting incoming analog signals received form the analog device to incoming digital signals, and for converting outgoing digital signals received from the digital device to outgoing analog signals.

The analog-digital-analog device includes a single digital-to-analog converter and switches for selectively configuring the analog-digital-analog circuit to effect conversion of incoming analog signals to incoming digital signals or, alternatively, to effect conversion of outgoing digital signals to outgoing analog signals.

It is, therefore, an object of this invention to provide an apparatus adaptable for use in effecting communications between an analog device and a digital device which is configured to share components in both analog-to-digital conversion functions as well as digital-to-analog conversion functions.

A further object of this invention is to provide an apparatus adaptable for use in effecting communications between an analog device and a digital device, the manufacture of which may be accomplished with economies of component trimming and chip area.

Still a further object of this invention is to provide an apparatus adaptable for use in effecting communications between an analog device and a digital device which is inexpensive to construct.

Further objects and features of the present invention will be apparent from the following specification and claims when considered in connection with the accompanying drawings illustrating the preferred embodiment of the invention.

DETAILED DESCRIPTION OF THE DRAWINGS

DETAILED DESCRIPTION OF THE INVENTION

Figure 1:
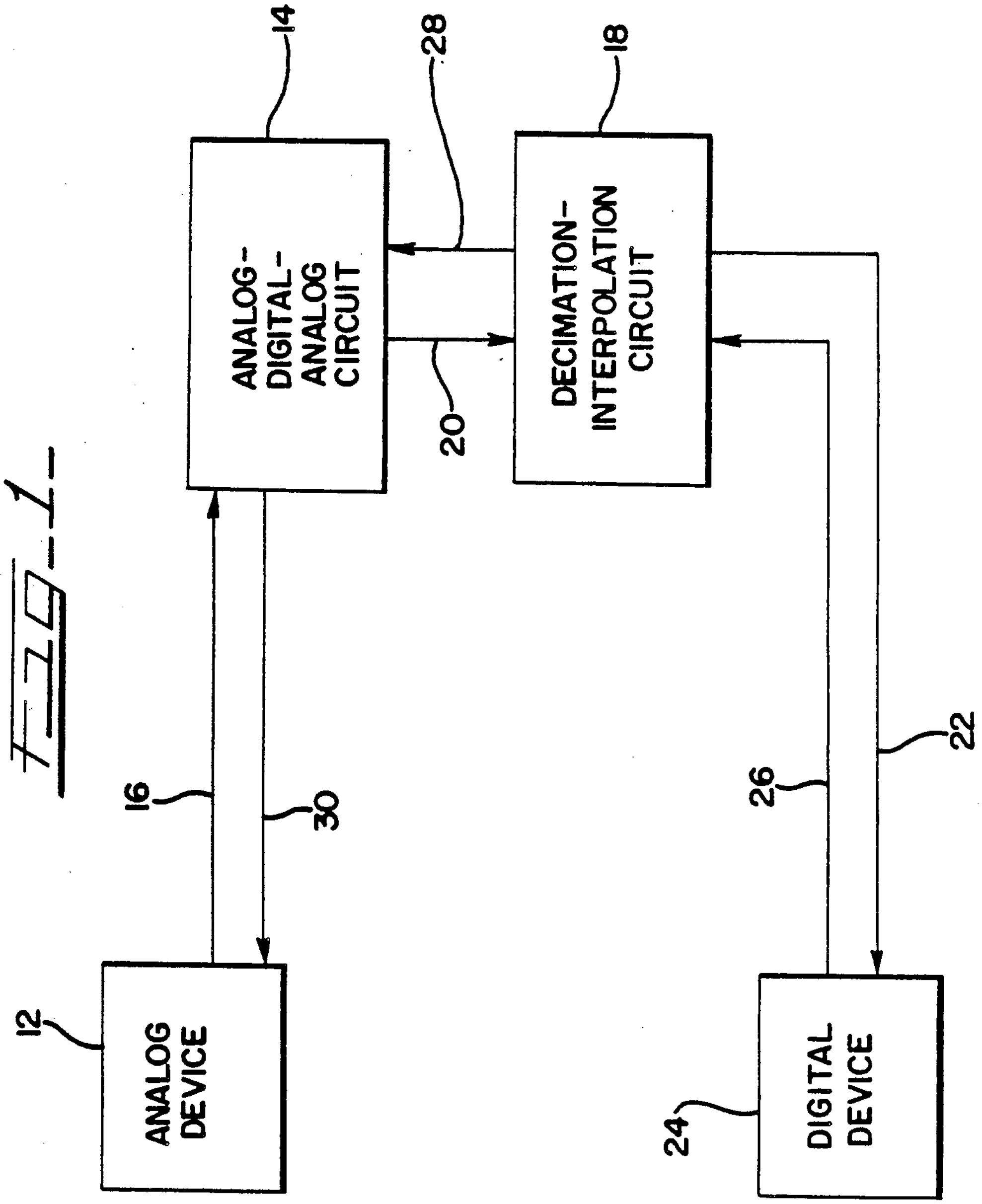
FIG. 1 is a schematic system block diagram of the environment in which the present invention is preferably employed.

The environment in which the preferred embodiment of the present invention is employed is illustrated in a schematic system block diagram in FIG. 1.

In FIG. 1, an analog device 12, such as a telephone voice instrument, is connected to an analog-digital-analog circuit 14. Typically, the analog device 12 operates in the audio frequency range, approximately 300 Hz to 3.4 KHz. The analog-digital-analog circuit 14 samples the incoming analog signal which is conveyed from the analog device 12 via line 16. The sample rate of the analog-digital-analog circuit 14 is, in the preferred embodiment, approximately 2 MHz. Some advantages are incurred by the high frequency sampling by the analog-digital-analog circuit 14: for example, a higher frequency of operation allows for closer spacing of components in the invention when the invention is configured as an integrated circuit, i.e., a silicon chip construction; and the high frequency sampling allows for a more accurate digital representation of the incoming analog signal.

Figure 2:
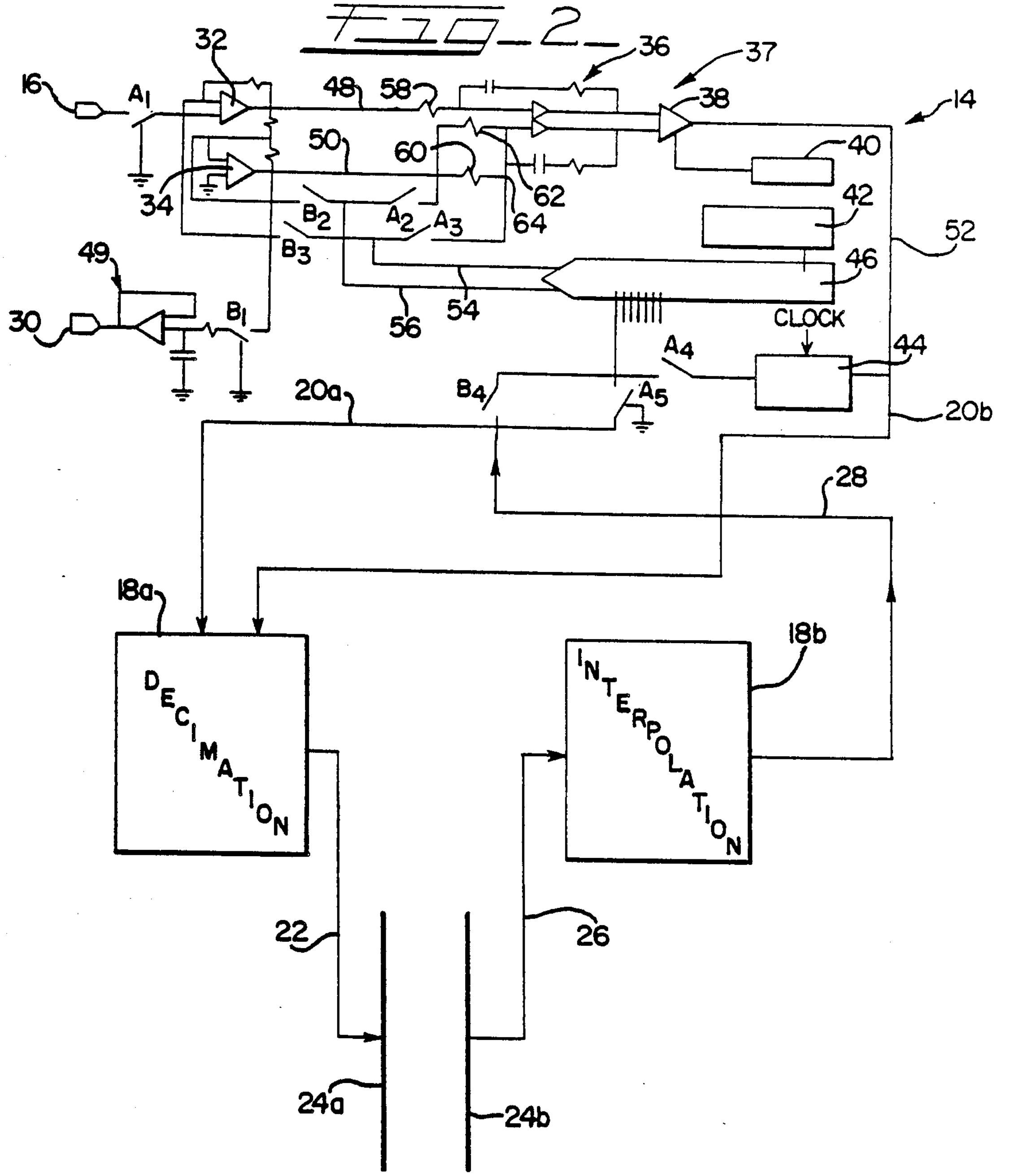
FIG. 2 is an electrical schematic diagram of the preferred embodiment of the present invention.

The analog-digital-analog circuit 14 converts the incoming analog signal received on line 16 to an incoming digital signal and conveys that incoming digital signal to a decimation-interpolation circuit 18 via line 20. Alternatively, the decimation-interpolation circuit 18 may be comprised of a separate decimation circuit and a separate interpolation circuit, as illustrated in FIG. 2. The decimation-interpolation circuit 18 of FIG. 1 receives the incoming digital signal on line 20, performs a decimation operation upon that signal, and outputs a decimated incoming digital signal on line 22. In the preferred embodiment, the incoming decimated digital signal is produced at a frequency of approximately 16 KHz, a frequency which still allows for obtaining the advantages of high frequency close spacing of components in a silicon chip structure and high resolution of the digital representation of the incoming analog signal. The incoming decimated digital signal is presented to the digital device 24 via line 22. The digital device 24 is, commonly, a device such as a data processing device or a computerized communications switching apparatus.

The digital device 24 provides outgoing digital signals to the decimation-interpolation circuit 18 via line 26. The decimation-interpolation circuit 18 performs an interpolation operation upon the outgoing digital signals received on line 26 and outputs interpolated digital signals via line 28 to the analog-digital-analog circuit 14. The analog-digital-analog circuit 14 receives the interpolated digital signals on line 28, converts those interpolated digital signals to outgoing analog signals, and provides the outgoing analog signals to the analog device 12 via line 30.

An electrical schematic diagram of the preferred embodiment of the present invention is present in FIG. 2.

For purposes of clarity in describing the preferred embodiment of the present invention, like elements will be labelled with like reference numerals throughout this description.

In FIG. 2, an analog-digital-analog circuit 14 receives incoming analog signals on line 16 from an analog device (not shown in FIG. 2) and outputs outgoing digital signals on line 30. Further, the analog-digital-analog circuit 14 conveys incoming digital signals to a decimation circuit 18*a* via lines 20*a* and 20*b* and receives interpolated digital signals from the interpolation circuit 18*b* via line 28.

The analog-digital-analog circuit 14, as illustrated in FIG. 2, includes operational amplifiers 32 and 34, integrator 36, comparator 38, clock 40, voltage/current reference source 42, counter 44, digital-to-analog converter 46, and output filter 48. Also, as illustrated in FIG. 2, the analog-digital-analog circuit 14 includes two groups of switches: a first group of switches labelled $A_1$, $A_2$, $A_3$, $A_4$, and $A_5$; and a second group of switches labelled $B_1$, $B_2$, $B_3$, and $B_4$. The settings of the A and B groups of switches determine the function performed by the analog-digital-analog circuit 14, as shall be described in greater detail below.

When the analog-digital-analog circuit 14 is configured for analog-to-digital conversion in order that incoming analog signals received at line 16 may be converted to representative digital signals and presented to decimation circuit 18*a* as incoming digital signals at lines 20*a* and 20*b*, the A-group of switches (switches $A_1$–$A_5$) are closed and the B-group of switches (switches $B_1$–$B_4$) are open. In such an orientation, positive portions of incoming analog signals are amplified by operation amplifier 32 and negative portions of incoming analog signals are amplified by operation amplifier 34. That is, the operation amplifiers 32 and 34 are configured, with the A-group of switches closed and the B-group of switches open, as voltage followers so that signals are present on line 48 representing positive values of voltages received via line 16, and signals are present on line 50 representing negative values of voltages received via line 16.

Before proceeding further, it is useful to note that a feedback circuit is established within the analog-digital-analog circuit 14: the output of the comparator 38 on the line 52, through the counter 44, through switch $A_4$, through the digital-to-analog converter 46. The digital-to-analog converter 46 produces a negative current output at line 54 and a positive current output at line 56, the negative and positive current outputs are representative of the digital signals which comprise the output of the comparator 38 on the line 52.

Thus, the output of the comparator 38 is fed back to the input of the integrator 36 after conversion to analog form. The voltages present at line 48 pass through resistor 58 in order that current signals representing positive values of voltages received via line 16 and current signals representing positive values of the digital output of comparator 38 are present at juncture 62. Further, the voltages present at line 50 pass through resistor 60 in order that current signals representing negative values of voltages received via line 16 and current signals representing negative values of the digital output of comparator 38 are present at juncture 64. The integrator 36 and the comparator 38 form a sigma-delta modulator 37. Thus, the sigma-delta modulator 37 compares present and past positive representations of the incoming analog signal, and present and past negative representations of the incoming analog signal. The sigma-delta modulator 37, driven by the clock 40, operates in a manner whereby the output of the comparator 38, which appears at line 52, is a digital signal indicating a plus or a minus step signal, depending upon whether the feedback signals from lines 54 and 56 are greater than or less than the respective incoming analog signals appearing at junctures 62 and 64.

The analog-digital-analog circuit 14, thus configured for analog-to-digital conversion, seeks to match the current representations of the output of the comparator 38, which appear at lines 54 and 56, with the current representations of the incoming analog signal appearing at junctures 62 and 64. The analog-digital-analog circuit 14, in the preferred embodiment of its analog-to-digital conversion configuration, allows only one-step correction per sample to seek to equalize the output of the comparator 38 and the input of the integrator 36.

When the analog-digital-analog circuit 14 is configured for digital-to-analog conversion in order that interpolated digital signals received via line 28 from the interpolation circuit 18*b*, the B-group of switches (switches $B_1$–$B_4$) are closed and the A-group of switches (switches $A_1$–$A_5$) are open. In such an orientation, the counter 44 is effectively excluded from the analog-digital-analog circuit 14. The interpolated digital signals are applied via line 28 directly to the digital-to-analog converter 46. The output lines 54 and 56 of the digital-to-analog converter 46 are connected to operational amplifiers 32 and 34 in a manner whereby operational amplifiers 32 and 34 act as current-to-voltage converters. The outputs of operational amplifiers 32 and 34 pass through output filter 49 and are presented at line 30 as outgoing analog signals for use by an analog device (not shown in FIG. 2).

It is to be understood that, while the detailed drawings and specific examples given describe preferred embodiments of the invention, they are for the purpose of illustration only, that the apparatus of the invention is not limited to the precise details and conditions disclosed, and that various changes may be made therein without departing from the spirit of the invention which is defined by the following claims.

We claim:

1. An apparatus adaptable for use in effecting communications between an analog device and a digital device, the apparatus comprising:

an analog-digital-analog means for converting analog signals to digital signals and for converting digital signals to analog signals;

said analog-digital-analog means including a single digital-to-analog converter, a first group of switches, and a second group of switches;

said analog-digital-analog means further including a convertible interface means for operatively connecting with said analog device;

said digital-to-analog converter, said first group of switches, said second group of switches and said convertible interface means being operatively connected whereby closing said first group of switches, while keeping said second group of switches open, configures said analog-digital-analog means for converting analog signals to digital signals and configures said convertible interface means as a voltage follower circuit, and whereby closing said second group of switches, while keeping said first group of switches open, configures said analog-digital-analog means for converting digital signals to analog signals and configures said convertible interface means as a current-to-voltage converter circuit.

2. An apparatus adaptable for use in effecting communications between an analog device and a digital device as recited in claim 1 wherein said analog-digital-analog means further includes modulating means for comparing said incoming analog signal with a feed back output from said digital-to-analog converter and producing a digital modulator output, said digital modulator output indicating the relative levels of said incoming analog signal and said feedback output.

3. An apparatus adaptable for use in effecting communications between an analog device and a digital device, the apparatus comprising:

an analog-digital-analog means for converting incoming analog signals received from said analog device to incoming digital signals and for converting outgoing digital signals originating from said digital device to outgoing analog signals;

said analog-digital-analog means including a signal digital-to-analog converter, a convertible interface means for operatively connecting with said analog device, and switching means for determining the functional structure of said analog-digital-analog means;

said switching means having at least two orientations, including a first orientation whereby said digital-to-analog converter is sued to effect said converting of incoming analog signals to incoming digital signals and said convertible interface means is configured as a voltage follower circuit, and including a second orientation whereby said digital-to-analog converter is used to effect said converting of outgoing digital signals to outgoing analog signals and said convertible interface means is configured as a current-to-voltage converter circuit.

4. An apparatus adaptable for use in effecting communications between an analog device and a digital device, the apparatus comprising:

an analog-digital-analog means for converting incoming analog signals to incoming digital signals and for converting outgoing digital signals to outgoing analog signals;

said analog-digital-analog means including a signal digital-to-analog converter, switching means of determining the functional nature of said analog-digital-analog means, and a plurality of operational amplifiers;

said switching means having at least two orientations, including a first orientation for configuring said analog-digital-analog means to employ said digital-to-analog converter to effect said converting of incoming analog signals to incoming digital signals, to operatively connect said plurality of operational amplifiers to participate in receiving said analog signals and to perform as a voltage follower circuit; and further including a second orientation for configuring said analog-digital-analog means to employ said digital-to-analog converter to effect said converting of outgoing digital signals to outgoing analog signals, to operatively connect said plurality of operational amplifiers to perform as a voltage follower circuit.

5. An apparatus adaptable for use in effecting communications between an analog device and a digital device as recited in claim 4 wherein said analog-digital-analog means further includes modulating means for comparing said incoming analog signal with a feedback output form said digital-to-analog converter and producing a digital modulator output, said digital modulator output indicating the relative levels of said incoming analog signal and said feedback output.

* * * * *